United States Patent
Yang (10) Patent No.: US 7,339,425 B2
(45) Date of Patent: Mar. 4, 2008

(54) CLASS-D AUDIO AMPLIFIER WITH HALF-SWING PULSE-WIDTH-MODULATION

(75) Inventor: Cheng-Chung Yang, Kaohsiung (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 58 days.

(21) Appl. No.: 11/462,166

(22) Filed: Aug. 3, 2006

(65) Prior Publication Data
US 2008/0030267 A1    Feb. 7, 2008

(51) Int. Cl.
*H03F 3/38*    (2006.01)
(52) U.S. Cl. ......................... 330/10; 330/251
(58) Field of Classification Search .............. 330/10, 330/251, 207 A
See application file for complete search history.

(56) References Cited

U.S. PATENT DOCUMENTS

| | | | |
|---|---|---|---|
| 4,240,036 A * | 12/1980 | Kohler | ........................ 330/10 |
| 5,077,539 A | 12/1991 | Howatt | |
| 6,211,728 B1 | 4/2001 | Chen et al. | |
| 6,262,632 B1 | 7/2001 | Corsi et al. | |
| 6,545,533 B2 | 4/2003 | Karki et al. | |
| 6,614,297 B2 | 9/2003 | Score et al. | |
| 6,847,257 B2 | 1/2005 | Edwards et al. | |
| 7,135,922 B2 * | 11/2006 | Zepp | ........................ 330/251 |
| 7,161,421 B2 * | 1/2007 | Honda | ........................ 330/10 |
| 7,279,966 B2 * | 10/2007 | Krishnan et al. | ............. 330/10 |
| 2004/0232978 A1 | 11/2004 | Easson et al. | |

OTHER PUBLICATIONS

Definition of PMW Amplifier from Wikipedia, the free encyclopedia, http://en.wikipedia.org/wiki/Class_D_amplifier, (Feb. 2006) visited Mar. 3, 2006.
Sergio Sanchez Moreno, "Class D Audio Amplifiers - Theory and Design," The Audio Pages, Elliott Sound Products, pp. 1-15, ( © Jun. 2005), http://sound.westhost.com/articles/pwm.htm, visited Mar. 3, 2006.

* cited by examiner

*Primary Examiner*—Henry Choe
(74) *Attorney, Agent, or Firm*—Duane Morris LLP (57) ABSTRACT

An amplifier includes a first comparator, a second comparator, and an output switch. The first and second comparators respectively compare a pair of differential signals with a half-swing modulation signal to generate first and second pulse-width-modulation (PWM) control signals, wherein a voltage swing of the half-swing modulation signal is smaller than voltage swing of the differential signals. The output switch includes a pair of inputs coupled to receive the PWM control signals to provide a ternary encoded output signal in response to the PWM control signals.

23 Claims, 6 Drawing Sheets

Fig.5A Single-ended to differential input stage

CLASS-D AUDIO AMPLIFIER WITH HALF-SWING PULSE-WIDTH-MODULATION

FIELD OF THE INVENTION

The present invention relates generally to amplifiers, and more particularly to Class-D audio amplifiers and modulation schemes therefor.

BACKGROUND OF THE INVENTION

Pulse-width-modulation (PWM) amplifiers, also known as Class-D amplifiers, operate on a similar principle as that of switching power supplies except that the reference voltage of a PWM amplifier is a varying signal instead of a fixed voltage.

Generally, Class-D amplifiers are classified as analog-input Class-D and digital-input Class-D, i.e., fully digital audio amplifier.

Class-D amplifiers are much more power efficient than Class-AB amplifiers. Because of their greater efficiency, Class-D amplifiers require smaller power supplies and eliminate or reduce the need for heat sinks, significantly reducing overall system cost, size and weight. Other benefits include longer battery operation, a quiet and better listening environment, and an integrated audio amplifier with high output power (>20 W/Channel).

A traditional Class-D amplifier requires an output filter, which increases system size and solution cost, limiting its use in portable devices. Filterless Class-D amplifiers eliminate the output filter while keeping the efficiency benefit. The filterless modulation scheme brings Class-D amplifiers approximately equal to Class-AB amplifiers in cost and size, but with great efficiency advantages.

One method of achieving filterless Class-D operation, increased efficiency, and reduced cost is to deliver current to the load only when needed, and once delivered, maintain the current, thereby not decaying or wasting energy in removing the current from the load when no input signal is delivered. One such methodology is a quaternary modulation scheme that has four states of operation. The modulation scheme uses the four states to drive a load such as a speaker, depending on the audio input signal. This quaternary scheme is described in detail, for example, in U.S. Pat. No. 6,262,632 to Corsi et al., the entirety of which is hereby incorporated by reference herein.

Eliminating the filter causes the Class-D amplifier to radiate electromagnetic interference (EMI). This EMI phenomenon is also addressed by Score et al. in U.S. Pat. No. 6,614,297, the entirety of which is hereby incorporated by reference herein. Score et al. describes a system where ternary PWM coding is used rather than traditional binary PWM coding or quaternary PWM coding. EMI is improved as $\Delta V$ for the ternary PWM is |VDD| whereas it is |2VDD| for binary PWM. Although ternary PWM coding can be achieved by quaternary switching behavior, the common-mode EMI component of ternary PWM coding by quaternary switching behavior is larger than by ternary switching behavior.

While the modulation scheme and amplifier of Score et al. improve EMI performance, as well as efficiency at small inputs with filterless operation, the technique of Score et al. require a logic module to encode the 4-state switching signal (quaternary) to three state switching signal (ternary) in order to realize these advantages.

An improved modulation scheme is desired for ternary PWM coding generation for Class-D amplifiers, and particularly for analog-input Class-D amplifiers.

SUMMARY OF THE INVENTION

An amplifier is provided including first and second comparators for respectively comparing a pair of differential signals with a half-swing modulation signal to generate first and second pulse-width-modulation (PWM) control signals, wherein a voltage swing of the half-swing modulation signal is smaller than voltage swing of the differential signals. The output switch including a pair of inputs coupled to receive the PWM control signals to provide a ternary encoded output signal in response to the PWM control signals.

In embodiments, the amplifier is a Class-D audio amplifier including a differential amplifier responsive to an audio input signal to generate a pair of differential signals; first and second comparators for respectively comparing a pair of differential signals with a half-swing modulation signal to generate first and second pulse-width-modulation (PWM) control signals, wherein voltage swing of the half-swing modulation signal is smaller than voltage swing of the differential signals; and an H-bridge output stage comprising a pair of outputs, the H-bridge output stage responsive to the PWM control signals to provide an amplified ternary encoded audio output signal to a load across the pair of outputs.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1A:
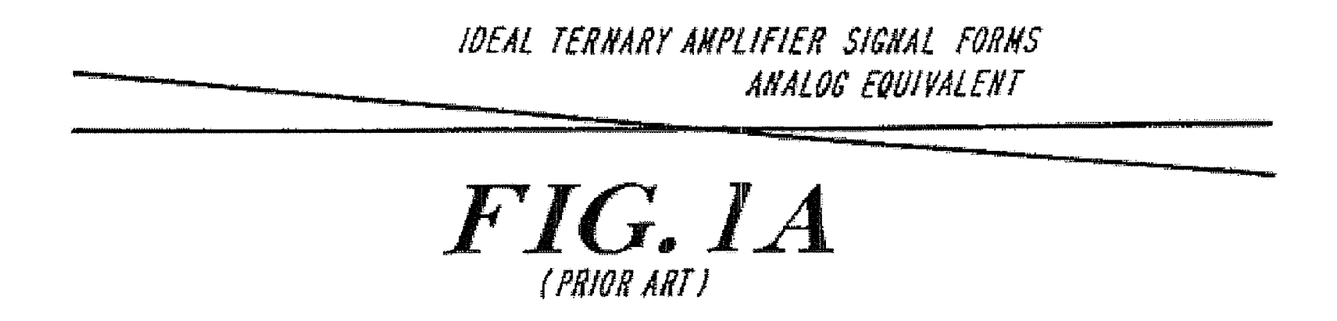
FIGS. 1A and 1B illustrate ternary PWM of an analog input signal.
Figure 1B:
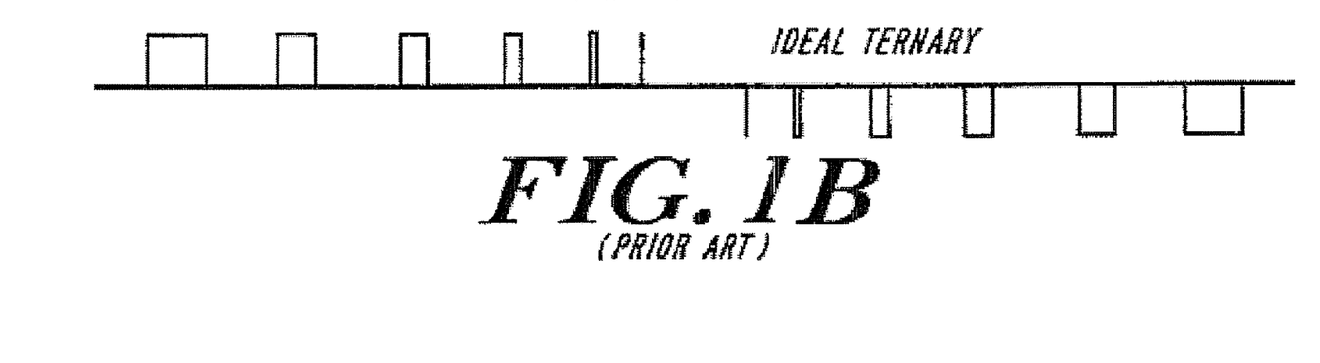
Figure 2:
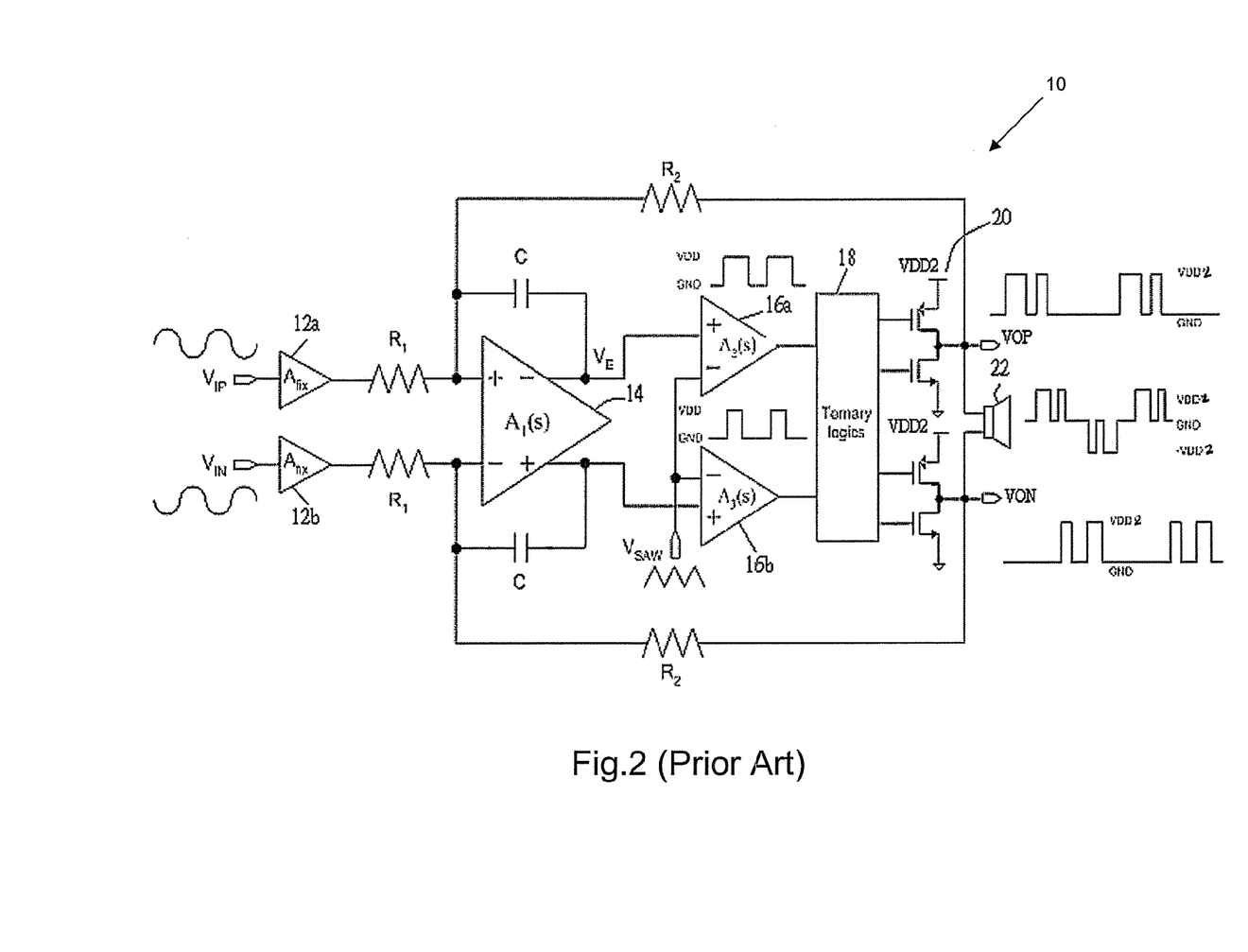
FIG. 2 is a circuit diagram of a prior art ternary PWM coded analog-input amplifier.

FIGS. 1A and 1B illustrate ternary pulse-width-modulation (PWM) of an analog input signal. With ternary PWM, the PWM encoded signal exists in one of three states relating to the amplitude of the sampled analog input signal: (i)+VDD, (ii) ground or (iii)–VDD. FIG. 2 is a circuit diagram of a prior art analog-input Class-D amplifier 10 with ternary PWM coding. An example of a Class-D amplifier with ternary PWM coding is shown in U.S. Pat. No. 5,077,539 to Howatt, the entirety of which is hereby incorporated by reference herein.

The Class-D amplifier 10 includes a pair of differential inputs labeled $V_{IP}$ and $V_{IN}$ coupled to fixed gain amplifiers 12a and 12b. The gain amplifiers 12a and 12b are pre-amplifiers and are optional. If the analog input signal is too small, an extra signal gain can be applied. In some implementations, the gain amplifiers 12a and 12b are designed with selectable gains to cope with various analog input signal ranges. However, whether these pre-amplifiers are used or not, they do not affect the operation of PWM of the amplifier 10. The outputs of the amplifiers 12a, 12b are coupled through resistors $R_1$ to the positive and negative inputs of differential operational amplifier 14. The operational amplifier 14 combines the input signals with the components of the feedback output signal to form a closed loop structure or system to improve the overall frequency response and stability of the system and to reduce any nonlinearity induced errors, thereby reducing noise distortion.

The differential signals outputted from amplifier 14 are provided to a pair of comparators 16a and 16b for modulation with a timing signal, specifically a full-swing triangle signal that traverses between 0V to VDD (i.e., the full swing of the differential signal), producing PWM output control signals. The resulting digital signals are provided to ternary power switch drive logic 18 to control the state of an output selecting switch circuit, i.e., H-bridge 20, for providing amplified differential outputs coupled to the load, e.g., speaker 22. The H-bridge circuit 20 is coupled to a single unipolar power supply (VDD2) for supplying an amplified switched output signal to load 22. The output signal provided to the load is a close replica of the input signal but having greater power supplied by the power supply, i.e., a power amplified version thereof. As shown in FIG. 2, the outputted ternary coded PWM waveform output signal is the difference between, i.e., subtraction of, the two PWM differential outputs (labeled $V_{OP}$ and $V_{ON}$).

Because of the use of a third state, i.e., a zero output state, the output circuitry dissipates power only in proportion to the output signal. Thus, for small signal inputs, the power loss is small. For a zero state signal, there is almost no current flowing through the speaker 22, so no losses occur. The reduction in power loss reduces heat generation and allows heat removal using smaller conductive heat sinks to the amplifier package or in some cases to the wiring interconnections alone without the use of heat sinks.

One problem with the circuit of FIG. 2, however, is that the ternary PWM coding scheme requires ternary logic block 18. The outputs of the signals from the comparators 16a, 16b cannot be provided directly to the H-bridge module 20 in order to provide a ternary encoded PWM output signal. EMI reduction is an important concern in class-D amplifier designs. The outputs of comparators 16a and 16b result in quaternary switching behavior in the H-bridge 20, which has a larger common-mode EMI component compared to the H-bridge with ternary switching behavior.

Figure 3:
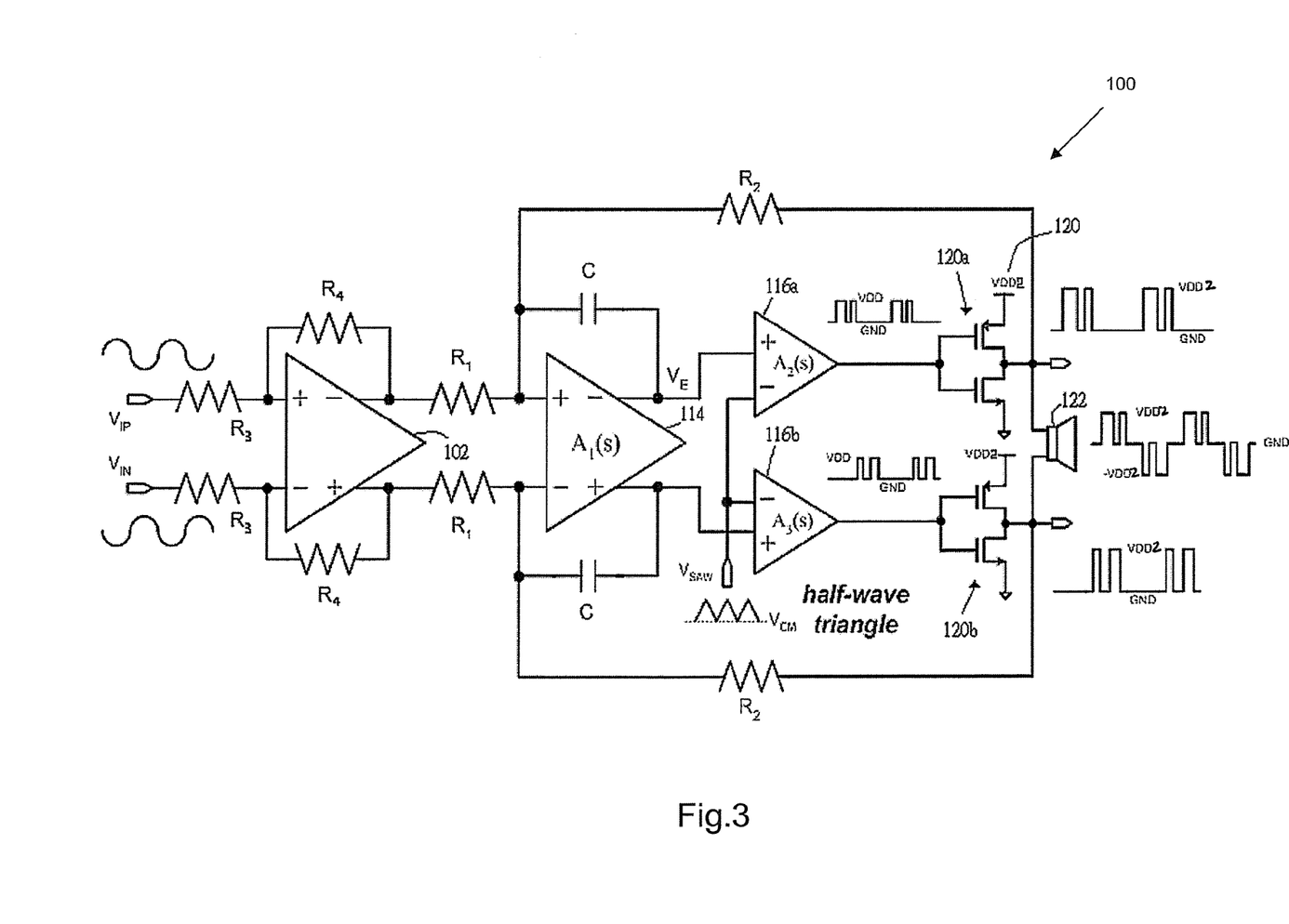
FIG. 3 is a circuit diagram of a ternary PWM coded analog-input audio amplifier with half-swing PWM according to an embodiment of the present invention.

FIG. 3 is a circuit diagram of a Class-D analog-input audio amplifier 100 with half-swing PWM according to an embodiment of the present invention. The amplifier 100 has a pair of differential inputs for receiving a pair of differential signals shown as $V_{IP}$ and $V_{IN}$. The differential signals are provided through resistors $R_3$ to a gain amplifier 102 having feedback resistors $R_4$, which operates in a manner similar to gain amplifiers 12a, 12b described above. The differential outputs of amplifier 102 are provided to the inputs of differential operational amplifier 114 through resistive elements $R_1$. As described above in connection with the circuit 10 of FIG. 2, the operational amplifier 114 of amplifier 100 combines the input signals with feedback signals to form a closed loop structure that reduces noise distortion. The feedback loops include a differential integrator including resistors R1, R2, capacitors C and operational amplifier 114. The feedback closed loop structure is preferred, though not required.

Like amplifier 10, amplifier 100 also includes a pair of comparators 116a, 116b which receive as inputs the differential outputs of the operational amplifier 114 and a modulation signal, described below in more detail. The amplifier 100 also includes a full bridge output topology 120, including a first or positive half portion 120a and a second or negative half portion 120b. Each half of H-bridge 120 includes a pair of transistors coupled in series between VDD2 and ground. Those in the art will understand that the pair of transistors can include two NMOS transistors, two PMOS transistors or an NMOS transistor and a PMOS transistor. Different types of H-bridges need different driver circuits, which couple the comparator outputs to the H-bridge. The most efficient MOSFET designs use N-channel MOSFETs on both the high side and low side because they have a lower ON resistance than P-channel MOSFETs. This design, however, is more complex since charge pump circuits typically are needed to drive the gates of the high side MOSFETs. The half portions 120a and 120b of the bridge topology 120 in the embodiment of FIG. 3 are each constructed with an NMOS transistor and a PMOS transistor to amplify the comparator outputs to the desired voltage level.

Rather than use a full-swing triangle wave as the modulation signal, the amplifier 100 of FIG. 3 uses a half-swing triangle wave (designated $V_{saw}$ in FIG. 3) as the modulation signal. By "half-swing," it is meant that the voltage swing of the modulation signal does not swing fully between ground and VDD, i.e., is smaller than voltage swing of the differential signals, as described in more detailed below. The voltage swing of the modulation signal is between $V_{CM}$ and the maximum (or the most positive) supply rail or between $V_{CM}$ and the minimum (or the most negative) supply rail, where $V_{CM}$ can be at any level between the maximum and the minimum supply rail. To maximize signal dynamic range, $V_{CM}$ is set at the common-mode voltage of the differential signals. Although the half-swing amplitude can be smaller than the peak-to-peak swing of modulated signals, setting the swing of the modulation signal at half of the supply range and setting $V_{CM}$ at the common-mode voltage of integrator can achieve better performance. More specifically, in one embodiment, the modulation signal $V_{saw}$ is a triangle signal that oscillates (a) between $V_{CM}$ and ($V_{CM}+V_{SW}$), where $V_{CM}$ is the common mode voltage of the integrator and $V_{SW}$ is the saw waveform amplitude, or (b) between $V_{CM}$ and ($V_{CM}-V_{SW}$).

Figure 4A:
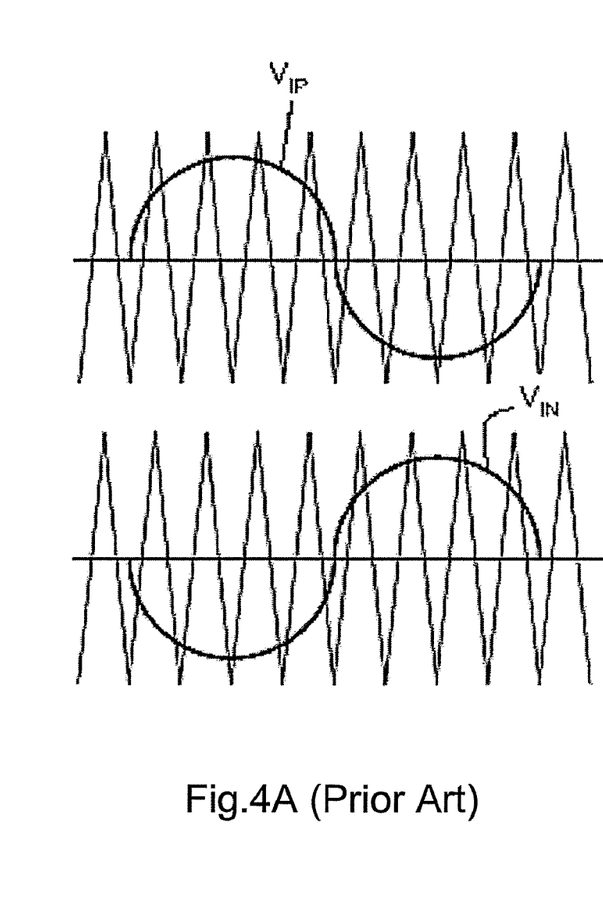
FIGS. 4A and 4B diagrammatically compare pulse width modulation of an analog input signal using a full-wave modulation signal and a half-swing modulation signal, respectively.
Figure 4B:
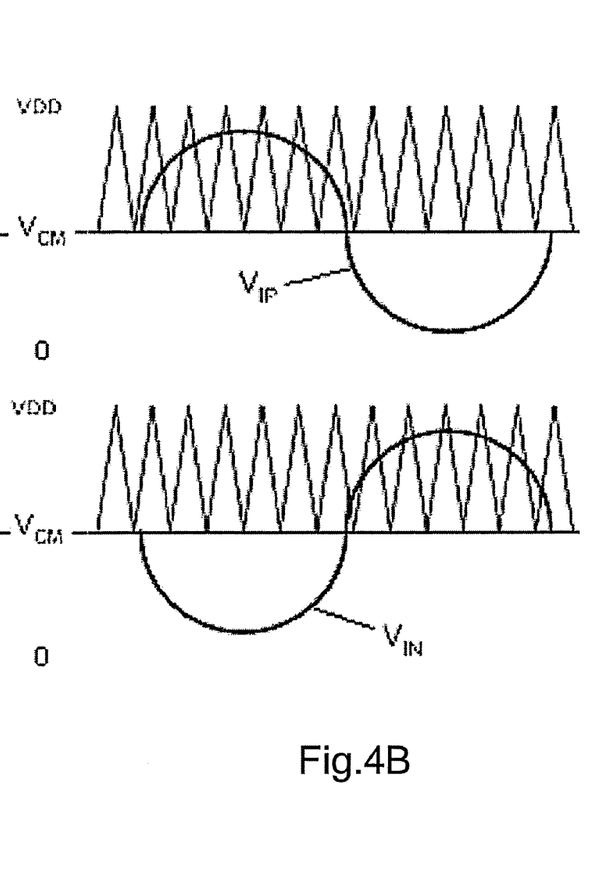

In general, designers will select the common mode voltage at VDD/2 to maximize signal dynamic range if the supply voltage rail is from 0V to VDD, though the signal common mode voltage can be at other levels. In this embodiment, $V_{CM}$ is set at VDD/2, the modulation signal $V_{sw}$ oscillates between VDD/2 and VDD or between VDD/2 and 0V. The theory behind the proposed modulation method is shown in FIGS. 4A and 4B, with FIG. 4A showing a sine wave signal (or other input signal) modulated with the prior art full swing triangle wave and with FIG. 4B illustrating the new modulation scheme using a half-swing triangle wave modulating signal that oscillates between $V_{CM}$ and VDD.

Figure 6:
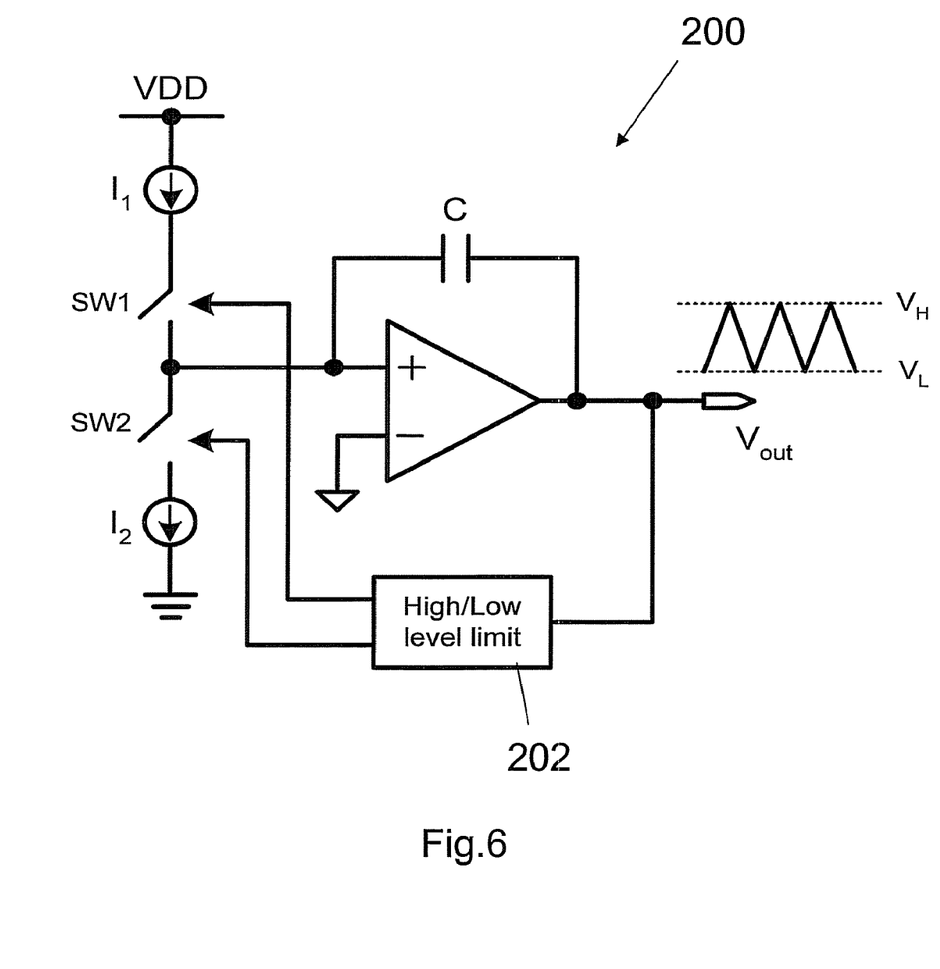
FIG. 6 is a circuit diagram of a half-swing triangle wave generator.

The modulation signal can be generated using a triangle wave/ramp generator. A circuit diagram of a triangle wave/ramp generator 200 is shown in FIG. 6. When switch SW1 is on, the current source $I_1$ charges the capacitor C. At the operational amplifier output $V_{out}$, a rising edge with a slope equal to $I_1/C$ is obtained. If $V_{out}>V_L$ (the high voltage limit set by High/Low level limit module 202), SW1 is off and switch SW2 is on. Thus, a falling edge at $V_{out}$ with a slope equal to $I_2/C$ is obtained. If $V_{out}<V_L$ (the low voltage limit set by High/Low level limit module 202), SW2 is off and SW1 is on. By repeating these operations, a triangle wave with voltage level between $V_H$ and $V_L$ is obtained. The control signals for SW1 and SW2 are generated from the High/Low level limit module 202, which also sets the swing range of the generated triangle wave.

Importantly, the use of half-swing modulation signal $V_{SW}$ allows for the direct generation of ternary PWM encoding without additional logic circuits but still has good EMI performance, such as is the case with logic circuit 18 of FIG. 2. However, unlike the circuit of FIG. 2, the outputs of the comparators 116a and 116b can be directly coupled to the output bridges 120 without further encoding, specifically to the gates of the NMOS and/or PMOS transistors within the bridge 120. The subtraction of outputs from the two comparators are 3-state switched directly without the need for encoding logic coupling the H-bridge to the comparator stage because only one output of the comparators can be at VDD (if at all) for any given switching period. Therefore, the extra logic operations are not necessary. This, in turn, reduces devices complexity and provides cost, power consumption and heat generation benefits.

Assuming the same triangle wave frequency, two PWM pulses are generated per each PWM conversion with the traditional full swing modulation technique. With the half swing modulation technique proposed herein, only one PWM pulse is generated for each PWM conversion. In other words, the effective PWM switching rate is reduced by half with the proposed technique, and power dissipation due to switching loss is reduced accordingly. Referring to FIG. 3, the amplified differential outputs of the first and second halves 120a, 120b of the H-bridge 120 are coupled to a load element (e.g., speaker 122) to provide the amplified ternary encoded PWM output signal. As mentioned, the proposed methodology reduces circuit complexity by removing the need for the ternary logic required by the prior art. Further, comparators 116a, 116b need not be rail-to-rail comparators, i.e., the comparators need not accept rail-to-rail input signals where the signal swing is between VDD and ground. Rail-to-rail comparators require both NMOS input and PMOS input stages to cope with rail-to-rail signals. Therefore, design complexities of rail-to-rail comparators are higher than comparators with only a NMOS input stage or a PMOS input stage, but not both. With the half-swing technique, since the triangle wave is at most between VDD and VCM or VCM and GND (i.e., VDD/2), rail-to-rail comparators are not necessary. The design also exhibits less sensitivity to triangle-wave nonlinearity, whereas prior art full-wave modulation suffers from nonlinearity mismatch of positive and negative triangle-wave cycles.

Figure 5A:
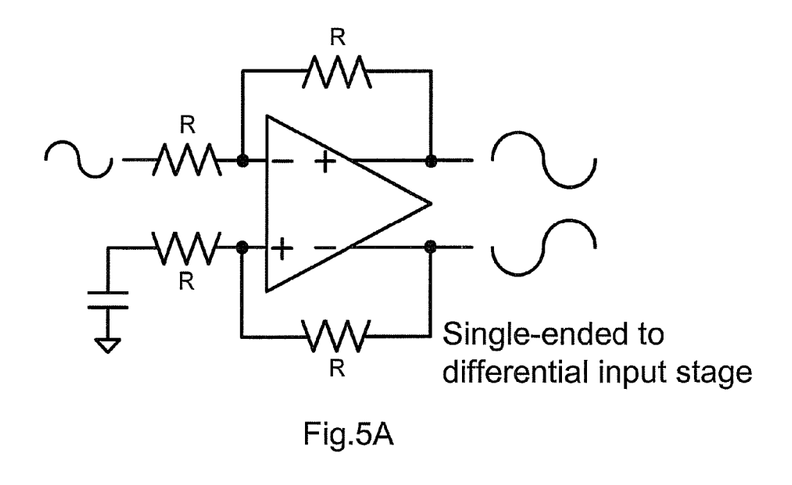
FIG. 5A models the feedback differential operational amplifier of the PWM amplifier of FIG. 3.
Figure 5B:
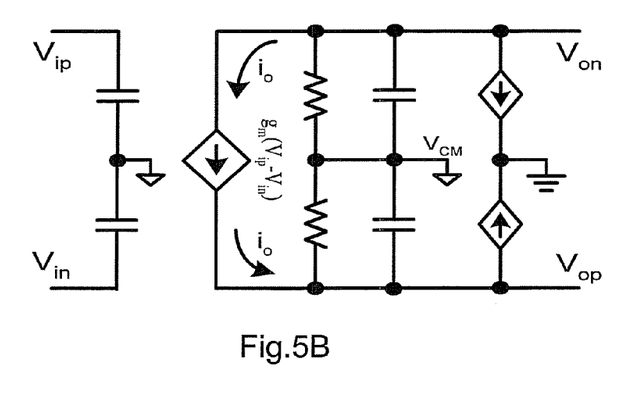
FIG. 5B represents the small-signal model of the differential operational amplifier.

FIGS. 5A and 5B expand further on why the half swing PWM technique works. As shown in FIG. 5A, with the half swing PWM, only one feedback signal in the differential path is "effective" in the differential operational amplifier at each PWM switching period. However, because of the operation of the differential operational amplifier, the opposite polarity signal in the other path is automatically constructed. Therefore, the closed-loop feedback works well and produces high performance outputs, e.g., audio outputs. FIG. 5B represents the small-signal model of differential operational amplifier 114 to depict the above-described half-swing PWM modulation technique.

Though the modulation methodology described above is shown used with a differential input signal, the method can be applied without change to single-ended input signals, as the operational amplifier 114 that provides the closed loop is of the differential type. Further, the half-swing PWM can also be applied to an open-loop structure, i.e., by eliminating the feedback components. However, a closed loop structure is preferred to suppress the noise induced from circuit nonlinearities. Still further, though a balanced triangle half-swing modulation signal is preferred, in embodiments, a half-swing sawtooth or sinusoidal waveform may be used as the modulation signal. Still further, with use of a digital-to-analog converter (DAC) familiar to those in the art, the amplifier 100 can be used with digital inputs, that is, the digital class-D audio amplifier.

In exemplary applications, the Class-D audio amplifier described herein is utilized in applications such as televisions, mobile phones, portable radios, portable multimedia players, notebooks, DVD players, speakers, etc. Though described in connection with Class-D amplifiers, the modulation switching scheme described herein may also be applied to thermoelectric cooler drivers, motor control devices and the like.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. An amplifier comprising:
   first and second comparators for respectively comparing a pair of differential signals with a half-swing modulation signal to generate first and second pulse-width-modulation (PWM) control signals, wherein said half-swing modulation signal has a voltage swing between a common mode voltage ($V_{cm}$) of said pair of differential signals and a preset voltage smaller than a voltage swing of said differential signals;
   an output switch comprising a pair of inputs coupled to receive said first and second PWM control signals to provide a ternary encoded output signal in response to said first and second PWM control signals; and
   means for providing said half-swing modulation signal, whereby generating said PWM control signals with said half-swing modulation signal enables said output switch to provide said ternary encoded output signal without intermediate ternary encoding of said PWM control signals interposed between said comparators and said output switch.

2. The amplifier of claim 1, wherein said output switch comprises an H-bridge output stage.

3. The amplifier of claim 2, wherein a first input from said pair of inputs is coupled to a first half of said H-bridge and a second input from said pair of inputs is coupled to a second half of said H-bridge.

4. The amplifier of claim 1, further comprising a feedback loop coupling said output signal to said first and second comparators.

5. The amplifier of claim 4, wherein said feedback loop comprises a differential integrator and said output switch has a pair of differential output nodes, wherein said output signals from said pair of differential output nodes are coupled to said differential integrator with said pair of differential signals.

6. The amplifier of claim 1, wherein said means for providing said half-swing modulation signal comprises a ramp generator for providing said half-swing modulation signal.

7. The amplifier of claim 1, wherein the preset voltage is a maximum voltage of said differential signals, or a minimum voltage of said differential signals.

8. The amplifier of claim 1, wherein said half-swing modulation signal is a half-swing triangle wave.

9. A Class-D audio amplifier, comprising:
a differential amplifier responsive to an audio input signal to generate a pair of differential signals;
first and second comparators for respectively comparing said pair of differential signals with a half-swing modulation signal to generate first and second pulse-width-modulation (PWM) control signals, wherein said half-swing modulation signal has a voltage swing between a common mode voltage ($V_{cm}$) of said pair of differential signals and a preset voltage smaller than a voltage swing of said differential signals;
an H-bridge output stage comprising a pair of outputs, said H-bridge output stage responsive to said PWM control signals to provide an amplified ternary encoded audio output signal to a load across said pair of outputs; and
a ramp generator for providing said half-swing modulation signal,
whereby generating said PWM control signals with said half-swing modulation signal enables said H-bridge output stage to provide said ternary encoded audio output signal without intermediate ternary encoding of said PWM control signals interposed between said comparators and said output stage.

10. The audio amplifier of claim 9, wherein said H-bridge comprises a pair of inputs coupled to receive said first and second PWM control signals.

11. The audio amplifier of claim 9, wherein a first half of said H-bridge comprises a pair of switches responsive to said first PWM control signal and a second half of said H-bridge comprises a pair of switches responsive to said second PWM control signal.

12. The audio amplifier of claim 9, further comprising a feedback loop coupling said output signal to said first and second comparators.

13. The audio amplifier of claim 12, wherein said feedback loop comprises a differential integrator comprising said differential amplifier and said pair of outputs of said H-bridge output stage is coupled to said differential integrator with said audio input signal.

14. The audio amplifier of claim 9, wherein the preset voltage is a maximum voltage of said differential signals, or a minimum voltage of said differential signals.

15. The audio amplifier of claim 9, wherein said half-swing modulation signal is a half-swing triangle wave.

16. The audio amplifier of claim 9, further comprising a digital-to-analog converter (DAC) coupled to said differential amplifier for converting a digital audio data into said audio input signal such that said Class-D audio amplifier is capable of processing said digital audio data.

17. A method of amplifying an input signal using ternary modulation comprising the steps of:
respectively comparing a pair of differential signals with a half-swing modulation signal to generate first and second pulse-width-modulation (PWM) control signals, wherein said half-swing modulation signal has a voltage swing between a common mode voltage ($V_{cm}$) of said pair of differential signals and a preset voltage smaller than a voltage swing of said differential signals; and
providing said PWM control signals to an output switch to provide a ternary encoded output signal in response to said PWM control signals, whereby generating said PWM control signals with said half-swing modulation signal enables said output switch to provide said ternary encoded output signal without intermediate ternary encoding of said PWM control signals interposed between said comparing and providing steps.

18. The method of claim 17, wherein said providing step comprises driving an H-bridge circuit with the first and second PWM control signals to provide an amplified ternary encoded differential output signal to a load.

19. The method of claim 17, further comprising the step of generating said pair of differential signals in response to said input signal.

20. The method of claim 17, further comprising the step of feeding said ternary encoded differential output signal back to said pair of differential signals.

21. The method of claim 17, wherein said input signal is an audio signal.

22. The method of claim 17, wherein the preset voltage is a maximum voltage of said differential signals, or a minimum voltage of said differential signals.

23. The method of claim 17, wherein said half-swing modulation signal is a half-swing triangle wave.

* * * * *